(12) United States Patent
Van Der Schoot et al.

(10) Patent No.: US 7,656,502 B2
(45) Date of Patent: Feb. 2, 2010

(54) LITHOGRAPHIC APPARATUS AND DEVICE MANUFACTURING METHOD

(75) Inventors: Harmen Klaus Van Der Schoot, Vught (NL); Noud Jan Gilissen, 's-Gravenzande (NL); Peter Paul Steijaert, Eindhoven (NL); Erik Roelof Loopstra, Heeze (NL); Nicolaas Rudolf Kemper, Eindhoven (NL); Nicolaas Ten Kate, Almkerk (NL); Johannes Catharinus Hubertus Mulkens, Waalre (NL); Martinus Hendrikus Antonius Leenders, Rhoon (NL); Hans Jansen, Eindhoven (NL); Marco Koert Stavenga, Eindhoven (NL); Jan Cornelis Van Der Hoeven, Veldhoven (NL); Bob Streefkerk, Tilburg (NL); Hernes Jacobs, Eindhoven (NL); Marcus Martinus Petrus Adrianus Vermeulen, Leende (NL)

(73) Assignee: ASML Netherlands B.V., Veldhoven (NL)

( * ) Notice: Subject to any disclaimer, the term of this patent is extended or adjusted under 35 U.S.C. 154(b) by 449 days.

(21) Appl. No.: 11/472,566

(22) Filed: Jun. 22, 2006

(65) Prior Publication Data

US 2008/0073602 A1 Mar. 27, 2008

(51) Int. Cl.
G03B 27/42 (2006.01)
(52) U.S. Cl. .......................... 355/53; 359/665
(58) Field of Classification Search .................. 355/53; 359/226.3, 665
See application file for complete search history.

(56) References Cited

U.S. PATENT DOCUMENTS

| 3,648,587 | A | * | 3/1972 | Stevens | 355/44 |
| 4,346,164 | A | * | 8/1982 | Tabarelli et al. | 430/311 |
| 4,509,852 | A | | 4/1985 | Tabarelli et al. | 355/30 |
| 6,766,817 | B2 | | 7/2004 | da Silva | |
| 6,918,404 | B2 | | 7/2005 | Dias da Silva | |
| 7,066,586 | B2 | | 6/2006 | da Silva | |
| 2004/0136494 | A1 | | 7/2004 | Lof et al. | 378/34 |
| 2004/0207824 | A1 | | 10/2004 | Lof et al. | 355/30 |
| 2004/0263809 | A1 | * | 12/2004 | Nakano | 355/30 |
| 2005/0018155 | A1 | * | 1/2005 | Cox et al. | 355/30 |
| 2005/0030498 | A1 | * | 2/2005 | Mulkens | 355/30 |

(Continued)

FOREIGN PATENT DOCUMENTS

EP 1 420 300 A2 5/2004

(Continued)

Primary Examiner—Diane I Lee
Assistant Examiner—Steven H Whitesell-Gordon
(74) Attorney, Agent, or Firm—Pillsbury Winthrop Shaw Pittman LLP

(57) ABSTRACT

An immersion lithographic projection apparatus is disclosed in which a liquid removal system surrounds a liquid supply system which provides liquid to a space between a projection system and a substrate. The liquid removal system is moveable relative to the liquid supply system and is controlled to have substantially zero velocity relative to the moving substrate table. The gap between the liquid supply system and the liquid removal system may be covered and the atmosphere between the liquid supply system and the liquid removal system above the substrate table may be maintained such that the vapor pressure of liquid is relatively high.

29 Claims, 7 Drawing Sheets

U.S. PATENT DOCUMENTS

| | | | |
|---|---|---|---|
| 2005/0068499 A1* | 3/2005 | Dodoc et al. | 353/10 |
| 2005/0088635 A1* | 4/2005 | Hoogendam et al. | 355/30 |
| 2006/0038968 A1 | 2/2006 | Kemper et al. | 355/18 |
| 2006/0114435 A1* | 6/2006 | Hazelton et al. | 355/53 |
| 2006/0158627 A1 | 7/2006 | Kemper et al. | 355/53 |
| 2007/0109512 A1* | 5/2007 | Kate et al. | 355/53 |
| 2007/0109513 A1* | 5/2007 | Leenders et al. | 355/53 |
| 2007/0110213 A1* | 5/2007 | Leenders et al. | 378/34 |

FOREIGN PATENT DOCUMENTS

| | | |
|---|---|---|
| EP | 1 420 300 A3 | 8/2005 |
| WO | WO 99/49504 | 9/1999 |
| WO | WO 2004086470 A1 * | 10/2004 |
| WO | WO 2005/064405 A2 | 7/2005 |
| WO | WO 2005/064405 A3 | 7/2005 |
| WO | WO 2005093791 A1 * | 10/2005 |

* cited by examiner

Fig. 2
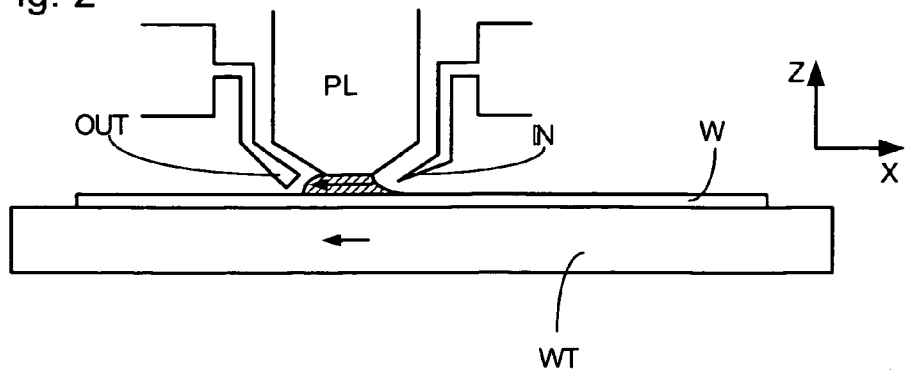
Fig. 3
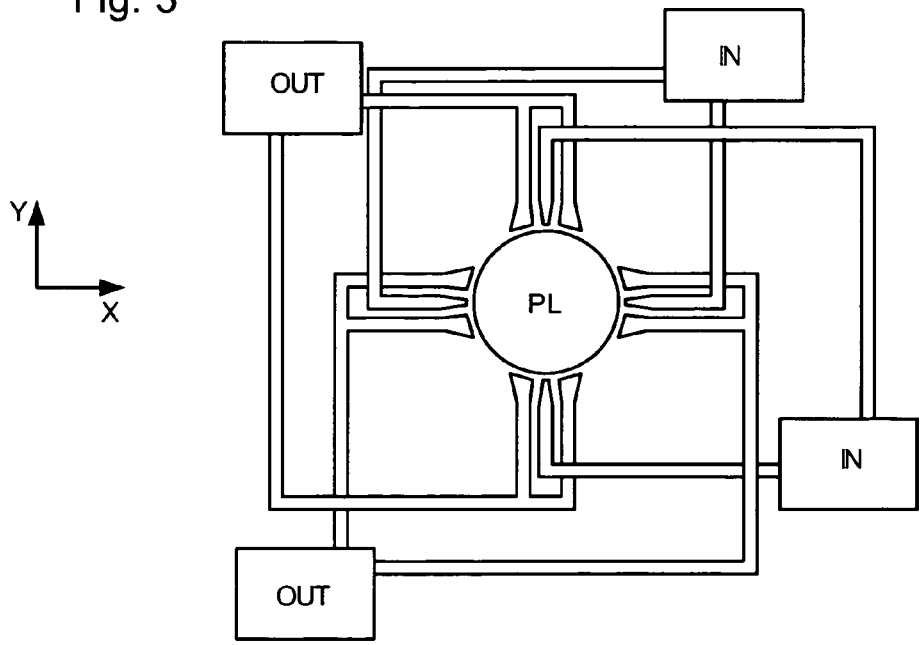
Fig. 4
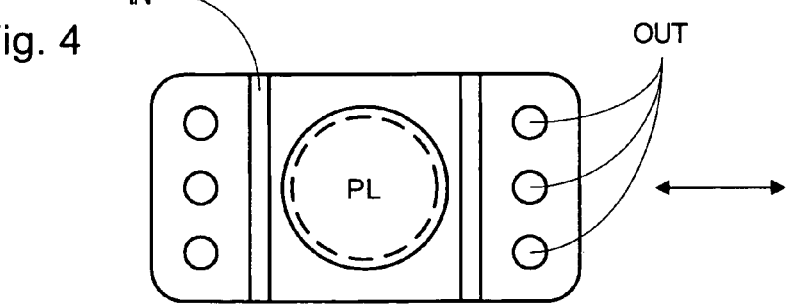
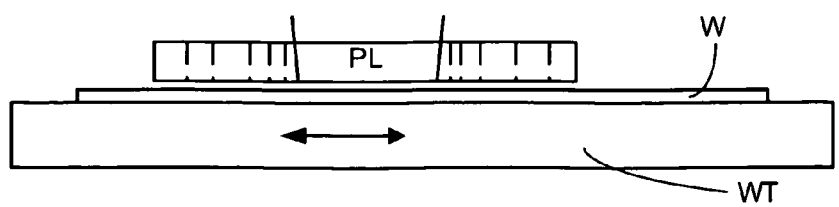

LITHOGRAPHIC APPARATUS AND DEVICE MANUFACTURING METHOD

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular-pattern around the final element.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

In European patent application publication no. EP 1420300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

Handling liquid in an immersion lithographic projection apparatus may presents various challenges including containment of the liquid, temperature control and/or interaction of the liquid with the top coat on the substrate.

SUMMARY

It is desirable, for example, to provide an apparatus in which one or more possible disadvantages of the presence of immersion liquid are alleviated.

According to an aspect of the invention, there is provided a lithographic projection apparatus, comprising: a projection system configured to project a patterned beam of radiation onto a substrate; a liquid supply system configured to provide a space between the projection system and a substrate with a liquid; and a liquid removal system comprising a barrier configured to at least partly contain liquid which has escaped from the liquid supply system surrounding the liquid supply system, the barrier being moveable relative to the liquid supply system and having a seal mechanism configured to seal between the barrier and the substrate, a substrate table configured to hold the substrate, or both.

According to an aspect of the invention, there is provided a lithographic projection apparatus, comprising: a substrate table configured to hold a substrate; a projection system configured to project a patterned beam of radiation onto the substrate; and a seal device configured to surround a substrate and to at least partly contain a liquid on a surface of the substrate, the substrate table, or both, the seal device moveable relative to the substrate table under the control of a controller, the controller adapted to move the seal device during at least some movements of the substrate table such that a relative velocity between the substrate table and the seal device is substantially zero.

According to an aspect of the invention, there is provided a lithographic projection apparatus, comprising: a projection system configured to project a patterned beam of radiation onto a substrate; a liquid supply system configured to provide liquid in a space between the projection system and a substrate, the space being smaller in plan than the substrate; and an enclosure configured to enclose a space radially outwardly of the liquid supply system and above the substrate.

According to an aspect of the invention, there is provided a device manufacturing method comprising pre-wetting a substrate prior to projecting a patterned beam of radiation using a projection system onto the substrate through a liquid, wherein liquid leaks from a space between the projection system and the substrate to cover the substrate.

According to an aspect of the invention, there is provided a device manufacturing method comprising projecting a patterned beam of radiation using a projection system onto the substrate through a liquid, wherein liquid leaks from a space between the projection system and the substrate to cover the substrate and the liquid comprises an additive for lowering the contact angle of the liquid on the substrate.

According to an aspect of the invention, there is provided a device manufacturing method comprising projecting a patterned beam of radiation onto a substrate through a liquid wherein the liquid is supplied by a liquid supply system and any liquid escaping from the liquid supply system is removed by a liquid removal system which surrounds the liquid supply system and moves relative to the liquid supply system.

According to an aspect of the invention, there is provided a device manufacturing method comprising projecting a patterned beam of radiation using a projection system through a liquid onto a substrate, wherein a sealing device surrounds the substrate and seals liquid on a surface of the substrate, a substrate table holding the substrate, or both, and wherein the sealing device is moved relative to the substrate table so that, during at least some movements of the substrate table, the relative velocity between the substrate table and the sealing device is reduced over the relative velocity which would exist if the sealing device remained stationary relative to the projection system.

According to an aspect of the invention, there is provided a device manufacturing method comprising projecting a patterned beam of radiation through a liquid onto a substrate, wherein the liquid is provided using a liquid supply system and a space radially outwardly of the liquid supply system is enclosed and maintained at a high vapor pressure of liquid.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 2 and 3 depict a liquid supply system for use in a lithographic projection apparatus;

FIG. 4 depicts a further liquid supply system for use in a lithographic projection apparatus;

DETAILED DESCRIPTION

Figure 1:
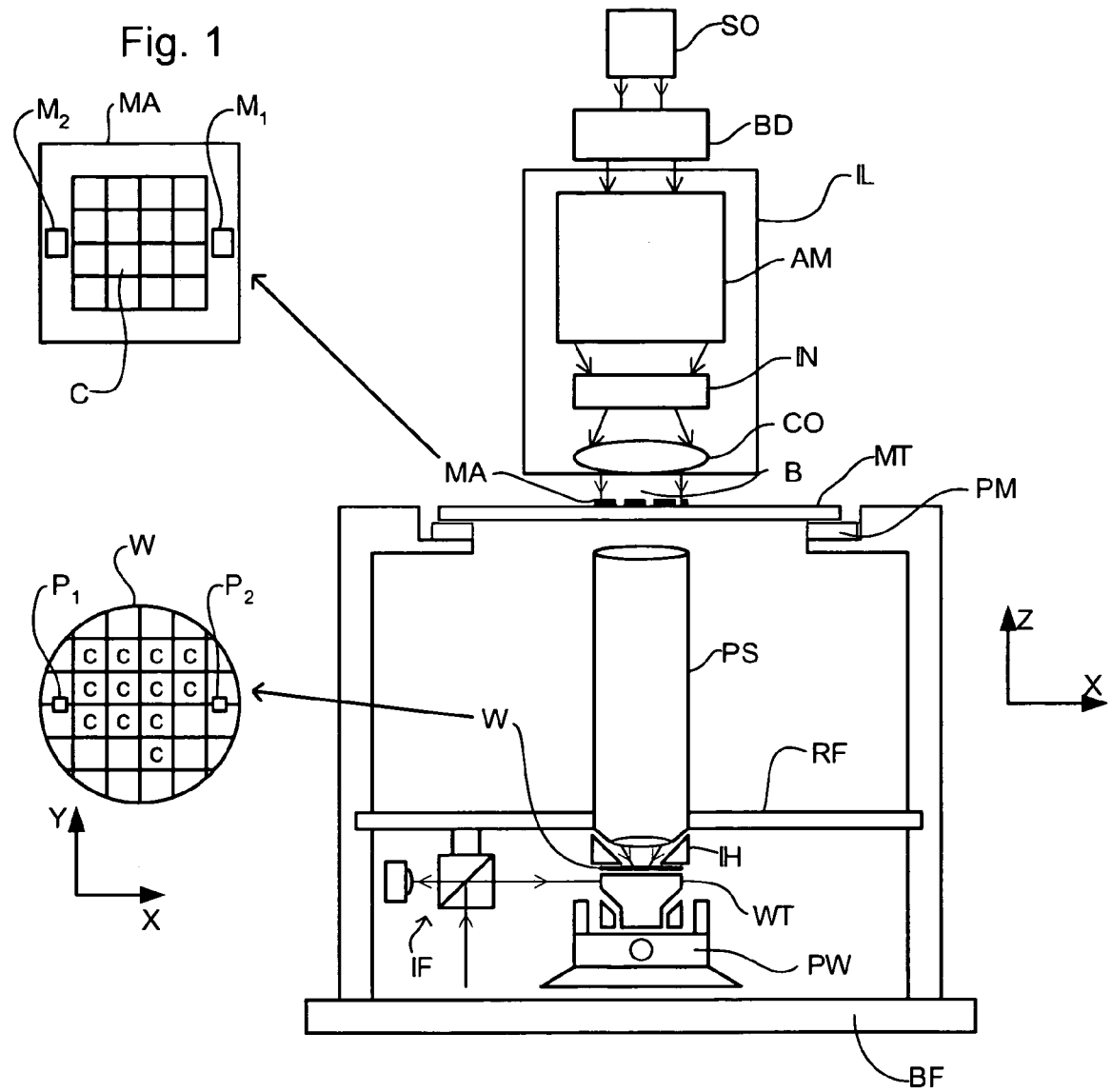
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features.

Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The solutions for providing liquid between a final element of the projection system PS and the substrate can be classed into two general categories. These are the bath type solutions in which the whole of the substrate W is immersed in a bath of liquid and the so called localized liquid supply systems in which liquid is only provided to a localised area of the substrate. In the latter category, the space filled by liquid is smaller in plan than the top surface of the substrate and the area filled with liquid remains stationary relative to the projection system PS whilst the substrate W moves underneath that area. Four different types of localized liquid supply systems are illustrated in FIGS. 2-6. The liquid supply systems disclosed in FIGS. 2-4 were described above.

Figure 5:
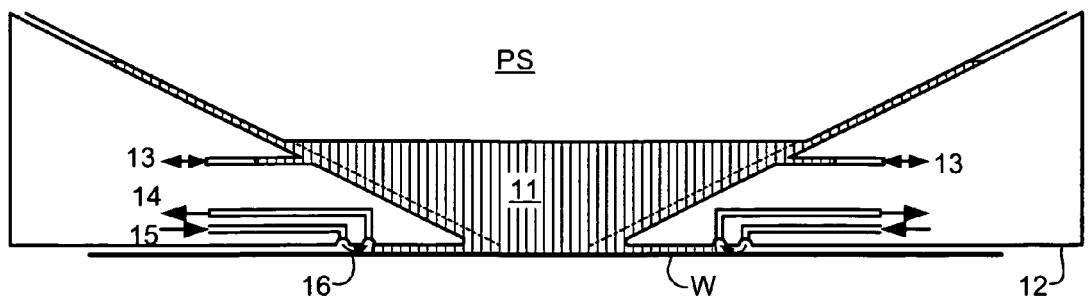
FIG. 5 depicts, in cross-section, a barrier member acting as a liquid supply system which may be used in an embodiment of the present invention as a liquid supply system or a liquid removal system or a sealing device.

FIG. 5 schematically depicts a localized liquid supply system with a barrier member, which extends along at least a part of a boundary of the space between the final element of the projection system and the substrate table. The barrier member is substantially stationary relative to the projection system in the XY plane though there may be some relative movement in the Z direction (in the direction of the optical axis). In an embodiment, a seal is formed between the barrier member and the surface of the substrate and may be a contactless seal such as a gas seal.

The barrier member 12 at least partly contains liquid in the space 11 between a final element of the projection system PL and the substrate W. A contactless seal 16 to the substrate may be formed around the image field of the projection system so that liquid is confined within the space between the substrate surface and the final element of the projection system. The space is at least partly formed by the barrier member 12 positioned below and surrounding the final element of the projection system PL. Liquid is brought into the space below the projection system and within the barrier member 12 by liquid inlet 13 and may be removed by liquid outlet 13. The barrier member 12 may extend a little above the final element of the projection system and the liquid level rises above the final element so that a buffer of liquid is provided. The barrier member 12 has an inner periphery that at the upper end, in an embodiment, closely conforms to the shape of the projection system or the final element thereof and may, e.g., be round. At the bottom, the inner periphery closely conforms to the shape of the image field, e.g., rectangular though this need not be the case.

The liquid is contained in the space 11 by a gas seal 16 which, during use, is formed between the bottom of the barrier member 12 and the surface of the substrate W. The gas seal is formed by gas, e.g. air or synthetic air but, in an embodiment, $N_2$ or another inert gas, provided under pressure via inlet 15 to the gap between barrier member 12 and substrate and extracted via outlet 14. The overpressure on the gas inlet 15, vacuum level on the outlet 14 and geometry of the gap are arranged so that there is a high-velocity gas flow 16 inwards that confines the liquid. The force of the gas on the liquid between the barrier member 12 and the substrate W contains the liquid in a space 11. Those inlets/outlets may be annular grooves which surround the space 11 and the flow of gas 16 is effective to contain the liquid in the space 11. Such a system is disclosed in United States patent application publication no. US 2004-0207824, hereby incorporated in its entirety by reference.

Other solutions are possible and, as will be described below, an embodiment of the present invention may use any type of localized liquid supply system as the liquid supply system and indeed, as described below, the means for forming the seal between the barrier member 12 and the substrate W can be used in the liquid removal system or sealing device of an embodiment of the present invention.

One or more localized liquid supply systems seal between a part of the liquid supply system and a substrate W. Relative movement of that part of the liquid supply system and the substrate W may lead to breakdown of the seal and thereby leaking of liquid.

Figure 6:
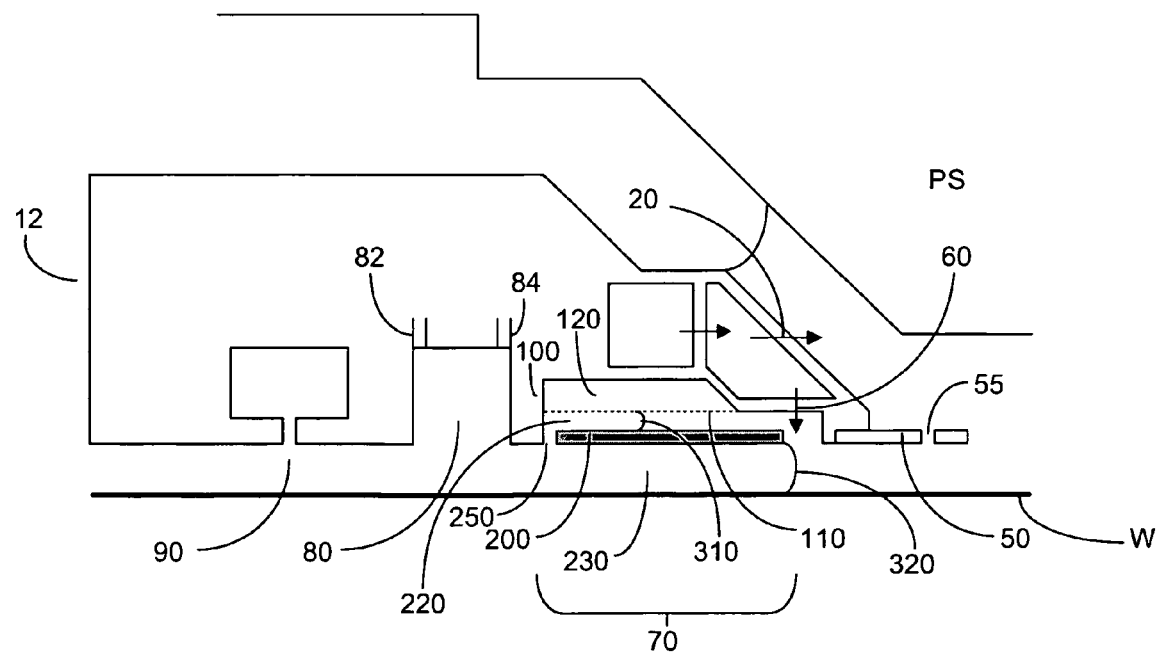
FIG. 6 illustrates, in cross-section, another barrier member which is being used as a liquid supply system which may be used in an embodiment of the present invention as a liquid supply system or a liquid removal system or a sealing device.

FIG. 6 illustrates a barrier member 12 which is part of a liquid supply system. The barrier member 12 extends around the periphery of the final element of the projection system PS such that the barrier member (which is sometimes called a seal member) is, for example, substantially annular in overall shape. The projection system PS may not be circular and the outer edge of the barrier member 12 may also not be circular so that it is not necessary for the barrier member to be ring shaped and it could also be other shapes so long as it has a central opening through which the projection beam may pass out of the final element of the projection system PS through liquid contained in the central opening and onto the substrate W. The barrier member 12 may be, for example, substantially rectangular and is not necessarily the same shape as the final element of the projection system PS is at the height of the barrier member 12.

The function of the barrier member 12 is to at least partly maintain or confine liquid in the space between the projection system PS and the substrate W so that the projection beam may pass through the liquid. The top level of liquid is simply contained by the presence of the barrier member 12 and the level of liquid in the space is maintained such that the liquid does not overflow over the top of the barrier member 12. A seal is provided between the bottom of the barrier member 12 and the substrate W. In FIG. 6 a seal device is configured to provide a contactless seal and is made up of several components. Working radially outwardly from the optical axis of the projection system PS, there is provided a (optional) flow plate 50 which extends into the space (though not into the path of the projection beam) which helps maintain substantially parallel flow of the immersion liquid out of outlet 20 across the space. The flow control plate has through holes 55 in it to reduce the resistance to movement in the direction of the optical axis of the barrier member 12 relative to the projection system PS and/or substrate W.

Moving radially outwardly along the bottom of the barrier member 12 there is then provided an outlet 60 which provides a flow of liquid in a direction substantially parallel to the optical axis towards the substrate. This flow of liquid is used to help fill any gaps between the edge of the substrate W and the substrate table WT which supports the substrate. If this gap is not filled with liquid, bubbles may be included in the liquid in the space between the projection system PS and the substrate W when an edge of the substrate W is passed under the seal. This is undesirable as it may lead to deterioration of the image quality.

Radially outwardly of the outlet 60 is a extractor assembly 70 to extract liquid from between the barrier member 12 and the substrate W. The extractor 70 will be described in more detail below and forms part of the contactless seal which is created between the barrier member 12 and the substrate W.

Radially outwardly of the extractor assembly 70 is a recess 80 which is connected through an inlet 82 to the atmosphere and via an outlet 84 to a low pressure source. Radially outwardly of the recess 80 is a gas knife 90. An arrangement of the extractor, recess and gas knife is disclosed in detail in U.S. patent application No. 60/643,626, filed 14 Jan. 2005. However, in that document the arrangement of the extractor assembly is different.

The extractor assembly 70 comprises a liquid removal device or extractor or inlet 100 such as the one disclosed in United States patent application publication no. U.S. 2006-0038968, incorporated herein its entirety by reference. Any type of liquid extractor may be used. In an embodiment, the liquid removal device 100 comprises an inlet which is covered in a porous material 110 which is used to separate liquid from gas to enable single-liquid phase liquid extraction. A chamber 120 downstream of the porous material 110 is maintained at a slight under pressure and is filled with liquid. The under pressure in the chamber 120 is such that the meniscuses formed in the holes of the porous material prevent ambient gas from being drawn into the chamber 120 of the liquid removal device 100. However, when the porous surface 110 comes into contact with liquid there is no meniscus to restrict flow and the liquid can flow freely into the chamber 120 of the liquid removal device 100. The porous surface 110 extends radially inwardly along the barrier member 12 (as well as around the space) and its rate of extraction varies according to how much of the porous material 110 is covered by liquid.

During scanning of the substrate W (during which the substrate moves under the barrier member 12 and projection system PS) the meniscus can be drawn either towards or away from the optical axis by a drag force applied by the moving substrate. This can lead to liquid loss which may result in evaporation of the liquid and thereby cooling of the substrate and consequent shrinkage and overlay errors as described above. Liquid stains may also or alternatively be left behind from interaction between the liquid droplets and resist photochemistry. A plate 200 is provided between the liquid removal device 100 and the substrate W so that the function of liquid extraction and the function of meniscus control can be separated from one another and the barrier member 12 may be optimized for each.

The plate 200 is a divider or any other element which has the function of splitting the space between the liquid removal device 100 and the substrate W into two channels, an upper channel 220 and a lower channel 230 wherein the upper channel 220 is between the upper surface of the plate 200 and the liquid removal device 100 and the lower channel 230 is between the lower surface of the plate 200 and the substrate W. Each channel is open, at its radially innermost end, to the space. The thickness of the plate is not critical. Although as illustrated in FIG. 6 the upper channel 220 extends horizontally, this is not necessarily the case. The reason for the upper channel 220 extending horizontally in FIG. 6 is because of the structural arrangement of the components. However, the upper channel 220 could also extend vertically or any where between horizontally and vertically. The gravitational pressure on the liquid in the upper channel 220 is very low and, if necessary, can be counteracted by applying an under pressure, for example through liquid removal device 100 itself or through another passage such as breathing holes 250 described below.

In an embodiment, the upper channel 220 between the liquid removal device 100 and the plate 200 is narrower than the lower channel 230 between the plate 200 and the substrate W. The lower channel is between 250 mm and 50 µm high, or between 100 and 60 µm depending on design (viscous drag length from flow pattern), fluid parameters (viscosity, density, surface tension) and surface properties (contact angle resulting from binding energy surface/liquid and liquid surface tension). The upper channel 220 has a stronger capillary action, for instance by making it 2 to 3 times narrower than the lower channel. Alternatively or additionally, the upper channel 220 may be made with a surface which is more liquidphillic than the lower channel 230. However, the upper channel 220 may also be wider than the lower channel 230. If the upper channel 220 is too narrow, liquid does not flow in that channel because the frictional resistance is too large and the pinned meniscus is fully loaded with hydrodynamic forces. Thus, if the upper channel 220 is made wider, for example in the region of 150 µm, than the lower channel 230 which could be perhaps 60 µm, these difficulties may be overcome. Above a channel width of 250 µm the capillary action is reduced. In order to promote capillary action, the upper channel 220 could be made liquidphillic or a height step close to the meniscus between the plate 200 and the liquid removal device 100 may be made such that the channel radially inwardly is wider than radially outwardly.

An under pressure may be applied in the upper channel 220, rather than leaving it open to the atmosphere through breathing holes 250 e.g. through the holes 250. In this way the upper channel 220 may be made wider.

With the plate 200, there are two meniscuses 310, 320. A first meniscus 310 is positioned above the plate 200 and extends between the porous surface 110 and the top surface of the plate 200 and a second meniscus 320 which is positioned underneath the plate 200 and which extends between the plate and the substrate W. In this way the extractor assembly 70 may be optimized for control of the first meniscus 310 for optimum extraction of liquid and for positional control of the second meniscus 320 such that the viscous drag length for the second meniscus 320 is reduced and the characteristics, in particular of the plate 200, are optimized to make it energetically favorable for the second meniscus 320 to remain adhered to the plate 200 such that the scan speed of the substrate W beneath the barrier member 10 may be increased. Capillary forces acting on the second meniscus 320 are outwards and are balanced by an under pressure in the liquid adjacent the second meniscus 320 so that the second meniscus 320 stays substantially still. Higher loading on the second meniscus 320, for example by viscous drag and inertia, results in a lowering of the contact angle of the second meniscus 320 with the surface.

One or more breathing holes 250 are provided at the radially outward most end of the plate 200 such that the first meniscus 310 is free to move inwardly and outwardly beneath the porous material 110 so that the extraction rate of the liquid removal device 100 may vary according to how much of the porous material 110 is covered by liquid. As illustrated in FIG. 6 the second meniscus 320 adheres to a lower inward edge of the plate 200.

In FIG. 6 the inner most bottom edge of the plate 200 is provided with a sharp edge so as to pin the second meniscus 320 substantially in place. The radius of the edge is, in an embodiment, less than 0.1 mm, less than 50 µm, less than 20 µm or about 10 µm.

An alternative or additional way of pinning the second meniscus 320 is to change the surface properties of the surface of the plate 200 to which the second meniscus 320 adheres. For example, a change from a liquidphilic to a liquidphobic surface in a radially outward direction on the plate 200 could also result in pinning of the second meniscus 320 at that change because the shape of the meniscus will need to invert for it to pass from the liquidphilic to the liquidphobic surface. Additionally or alternatively, the second meniscus 320 may be pinned by changing the surface of the plate 200 from a rough to a smooth surface. When fully wetted the rough surface can act as a meniscus trap. If the surface is not fully wetted and the liquid is only on the peaks of the roughness, a rough surface can act liquidphobic such as in the so called lotus effect. Also or additionally, electro wetting could be used to locally trap the meniscus. This has an advantage in that it can be turned on and off.

Although not specifically illustrated in FIG. 6, the liquid supply system has an arrangement to deal with variations in the level of the liquid. This is so that liquid which builds up between the projection system PS and the barrier member 12 can be dealt with and does not spill. Such a build-up of liquid might occur during relative movement of the barrier member 12 to a projection system PS described below. One way of dealing with this liquid is to provide the barrier member 12 so that it is very large so that there is hardly any pressure gradient over the periphery of the barrier member 12 during movement of the barrier member 12 relative to the projection system PS. In an alternative or additional arrangement, liquid may be removed from the top of the barrier member 12 using, for example, an extractor such as a single phase extractor similar to the extractor 120.

One of the difficulties with any of the localized area liquid supply systems is that it is difficult to contain all of the immersion liquid and to avoid leaving some behind on the substrate as the substrate moves under the projection system. In order to avoid liquid loss, the speed at which the substrate moves under the liquid supply system must be limited. This is particularly so with immersion liquids capable of generating high values of NA in the immersion lithography apparatus because they tend to have a lower surface tension than water as well as a higher viscosity. Breakdown speed of a meniscus scales with surface tension over viscosity so that high NA liquids may be far harder to contain. Leaving liquid behind on the substrate in only certain areas may lead to temperature variations throughout the substrate due to evaporation of the immersion liquid left behind on only certain areas of the substrate and thus leading to overlay errors. Also or alternatively, as the immersion liquid evaporates, it is possible that drying stains can be left behind on the substrate W. Also or alternatively, the liquid may diffuse into the resist on the substrate leading to inconsistencies in the photochemistry of the top surface of the substrate. Although a bath type solution (i.e. where the substrate is submerged in a container of liquid) would alleviate many of these problems, substrate swap in the immersion apparatus is particularly difficult with a bath type solution. An embodiment of the present invention addresses one or more of these issues as will be described below.

In an embodiment of the present invention a localized liquid supply system LSS is used to provide liquid below the projection system PS above the substrate W. A flow of liquid in that area is generated. For this purpose any localized liquid supply system may be used, e.g. any one of the types shown in FIGS. 2-6, such as those illustrated in FIG. 5 or 6 or variants thereof. However, the seal formed between the localized liquid supply system LSS and the substrate W does not need to be made to be particularly well and may in fact be entirely missing. For example, all of the components on the bottom side of the barrier member 12 may be missing from the FIG. 6 embodiment and optionally replaced only with a fluid seal (gas or liquid) such as that illustrated in FIG. 5. However, the type of seal or indeed complete absence of a seal is not critical to an embodiment of the present invention. The design is chosen such that a film of liquid covers the whole of the top surface of the substrate W as is illustrated in FIGS. 7a and b. This film of liquid is then contained by a sealing device such as a liquid removal system LRS which may again be comprised of a barrier member 12 similar to that illustrated in FIG. 5 or 6. The liquid removal system LRS is primarily designed with sealing and liquid removal in mind. The liquid removal may occur through a seal formed between the barrier member and the substrate W or may be performed by a separate functional element.

In an embodiment, a contactless seal (for example a fluid seal in the form of a gas or liquid seal) is formed between the liquid removal system LRS and the substrate W or substrate table WT. A controller 50 is provided to reduce the relative velocity of the liquid removal system LRS relative to the substrate W from that which it would be if the liquid removal system LRS were to be held stationary relative to the projection system PS during step and scanning motions of the substrate table WT. The reduction in this relative velocity increases the sealing performance of the contactless seal. In an embodiment, the liquid removal system LRS is moved to mirror the movement of the substrate table WT such that the relative velocity between the liquid removal system LRS and the substrate table WT during step and scan motions is substantially zero. However, this is not necessarily the case and there can be some relative velocity between those two items so long as the relative velocity is reduced below the level present if no movement of the liquid removal system LRS occurred and it were fixed relative to the projection system PS. The reduction in this relative velocity means that a better contactless seal can be formed between the substrate table WT or the substrate W and the liquid removal system LRS.

The liquid supply system LSS is held substantially stationary relative to the projection system PS during imaging such that, as can be seen from a comparison of FIGS. 7a and b, during imaging the liquid removal system LRS is substantially stationary relative to the substrate W which moves relative to the projection system PS whereas the liquid supply system LSS stays stationary relative to the projection system PS but the substrate W moves relative to the liquid supply system LSS. However, because there is no requirement for a particularly good seal between the liquid supply system LSS and the substrate W it is possible to move the substrate W at a higher velocity under the projection system PS than previously because leaking from the liquid supply system LSS does not matter. Indeed, it may be useful to manufacture the liquid supply system LSS from (or coat it in) a material with which the immersion liquid has a low contact angle e.g. less than 50°, less than 30° or less than 20°. The same applies for the substrate W and the substrate table WT. Furthermore, an advantage of this present system over a bath type solution is that force is not generally transferred from the moving substrate table WT into the projection system PS through the liquid 11 because the liquid supply system LSS generally acts as a barrier shielding or isolating the projection system PS from the liquid 11 on the substrate W. In an embodiment, the liquid supply system LSS is attached to the reference frame RF to which the projection system PS is also attached. The substrate table WT is attached to the base frame BF (from which the reference frame RF is dynamically isolated) and the liquid removal system LRS can be attached to the base frame BF via actuators which drive it.

Figure 7:
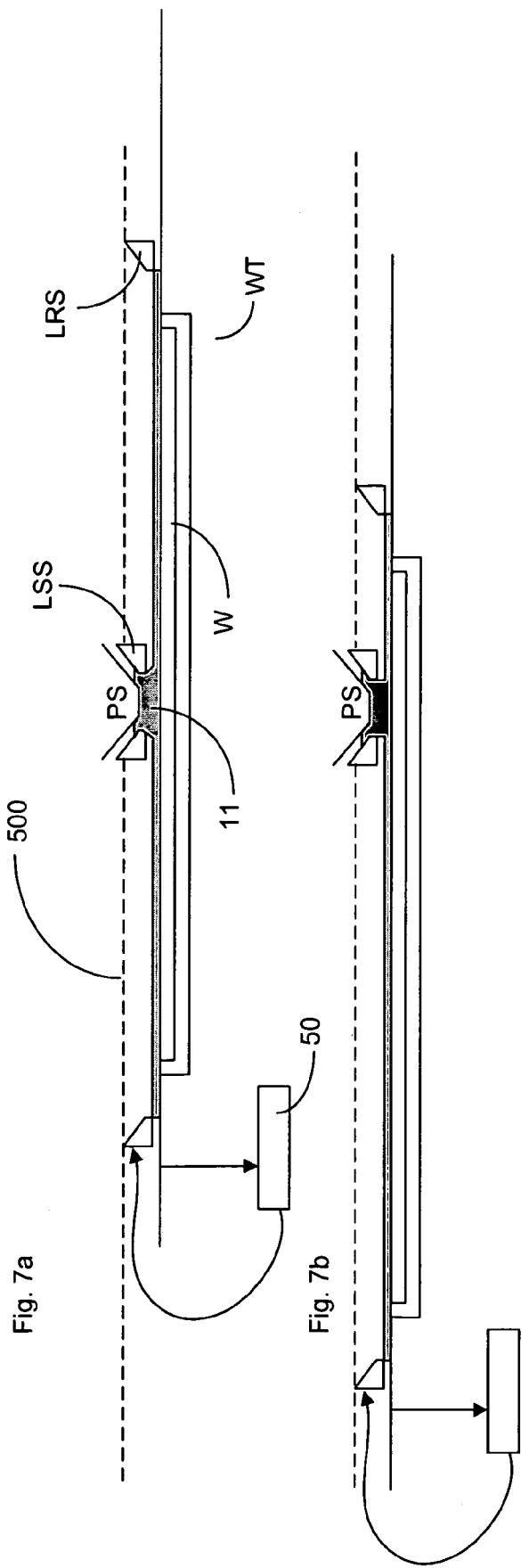
FIG. 7 illustrates, in cross-section, a liquid supply system and a liquid removal system in accordance with an embodiment of the present invention.

The liquid removal system LRS of FIG. 7 is illustrated as being large enough to surround the whole of the substrate W. This is advantageous because it allows the whole top surface of the substrate W to be covered in liquid thereby both maintaining the temperature of the substrate W substantially constant across its whole surface as well as maintaining the amount of dissolution of the top coat of the substrate into the immersion liquid (and diffusion of the immersion liquid into the top coat) across the whole top surface of the substrate W substantially constant. The liquid removal system LRS may also be large enough to cover any sensors on the top surface of the substrate table WT, for example, which are imaged by the projection beam from the projection system PS through immersion liquid. If this is not the case, the liquid removal system LRS may be moved to allow imaging of the sensors.

As will be appreciated from the above, a function of the liquid removal system LRS is to form a seal between it and the substrate table WT or substrate W. The liquid could actually be removed by a different component but it is convenient to provide the function of liquid removal and sealing in the same unit as in the described embodiments.

A similar principle is disclosed in PCT patent application publication no. WO 2005/064405. In that document a barrier member is also used to provide liquid to a space between a final element of the projection system PS and a substrate W but liquid is allowed to flow out of that area onto the whole top surface of the substrate. In WO 2005/064405 a rim is provided around the outer edge of the top surface of the substrate table to prevent the liquid from contaminating other areas of the apparatus. Other solutions are also possible including allowing the liquid to drain off the top surface of the substrate table WT and to be collected under the substrate table WT. This may include an arrangement whereby a component of the substrate table WT such as a chuck which is actuated by a short stroke actuator does not contain the liquid but wherein the liquid is allowed to flow off that chuck onto another component of the substrate table WT which other component is part of or is actuated by a long stroke positioning means. In another embodiment, similar to the embodiment disclosed in WO 2005/064405, liquid is collected in drains in top surface of a substrate table WT positioned around the outside of the substrate W or elsewhere on the substrate table WT.

As is illustrated in FIG. 7, a cover 500 may be provided between the liquid supply system LSS and the liquid removal system LRS to form an enclosure between the wall of the cover 500, the liquid supply system LSS and the liquid removal system LRS, the top surface of the substrate W and part of the top surface of the substrate table WT. The enclosure is partly filled with the immersion liquid lying on the top surface of the substrate table W and substrate table WT and the remainder of the enclosure is filled with gas. A humidity controller may be used to control the partial pressure of the immersion liquid in the gas. For example, if the partial pressure (humidity) of immersion liquid in that gas is maintained at 100%, or close to 100% such as at 80% or 90%, evaporation of the immersion liquid from the top of the substrate will be reduced or prevented thereby to help minimize temperature changes and/or drying stains. A bearing is provided between the cover 500 and the liquid removal system LRS and this embodiment of a single cover 500 which is substantially stationary relative to the projection system PS may take up a significant amount of space in a lithographic projection apparatus. However, other arrangements are possible which do not take up so much space and two such examples are illustrated in FIGS. 8-10.

With a contactless seal being formed between the liquid removal system LRS and the substrate table WT, substrate swap after finishing exposure of one substrate prior to exposing a further substrate becomes possible. This may be achieved without removing all of the liquid from the liquid supply system LSS and even without removing all of the liquid from within the liquid removal system LRS. During substrate swap a dummy substrate may be moved under the liquid removal system LRS and liquid supply system LSS as the substrate table WT holding the exposed substrate W is moved out from under the liquid removal system LRS and liquid supply system LSS. Thus, the final element of the projection system PS can be maintained wet during substrate swap. Then the dummy substrate is moved out from under the liquid removal system LRS and liquid supply system LSS as the new substrate W is moved under those components. Alternatively it is possible to only maintain the liquid supply system LSS running during substrate swap as this is really the only component which should be maintained running so that the final element of the projection system PS is maintained wet during substrate swap. Direct swap, without the intervening dummy substrate is also possible.

Figure 8:
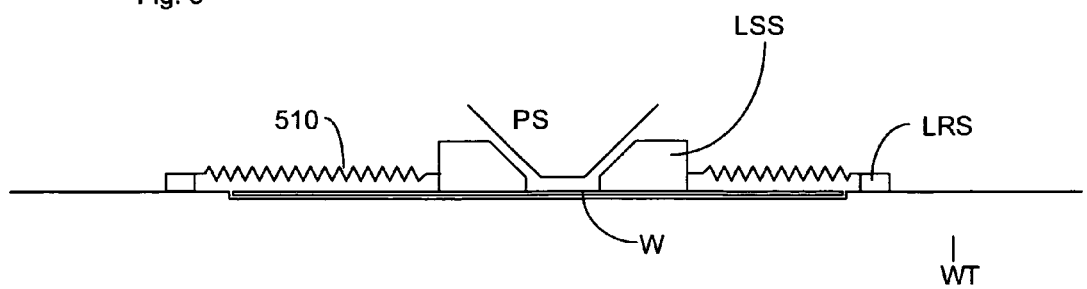
FIG. 8 depicts, in cross-section, an embodiment of the present invention.

In the embodiment of FIG. 8 the solid cover 500 is replaced by a bellow type cover 510. The two dimensional bellows allow limited relative movement of the liquid removal system LRS to the liquid supply system LSS.

Figure 9A:
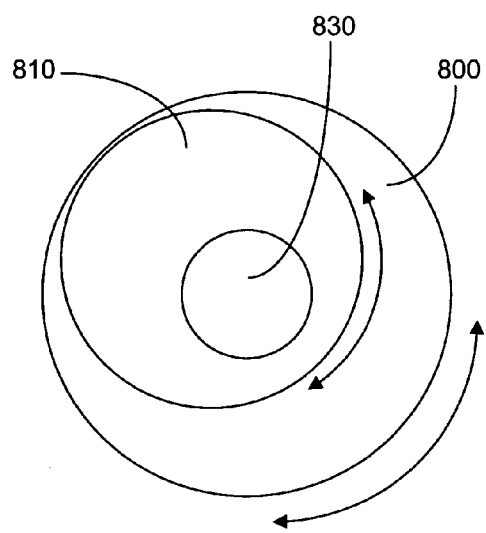
FIG. 9 illustrates, in plan, a variant of the embodiment in FIG. 8.
Figure 9B:
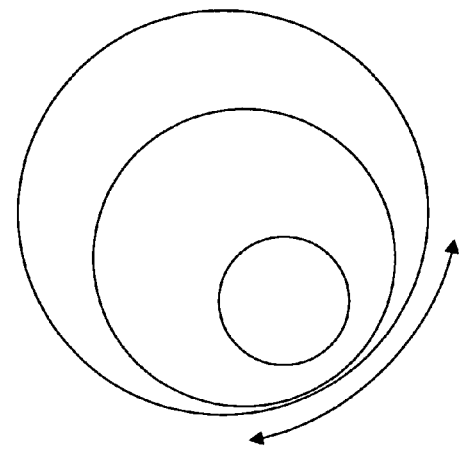
Figure 10:
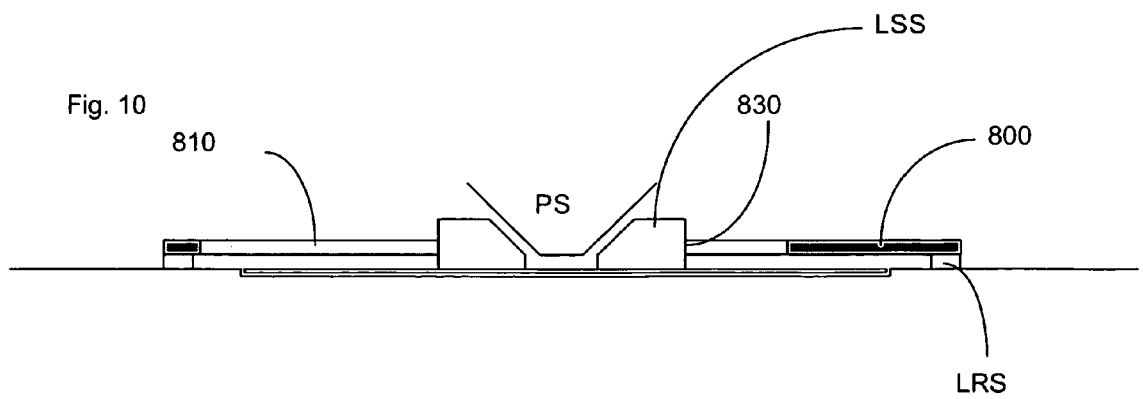
FIG. 10 illustrates, in cross-section, the embodiment of FIG. 9.

FIGS. 9a and b show a further alternative to the cover 500 of FIG. 7. In this embodiment the cover comprises two plates (e.g., discs). A first, larger plate 800 is rotatable relative to the liquid removal system LRS. A second plate 810 is positioned in or above a through hole in the first plate 800 and is rotatable about the central axis of the through hole. A through hole 830 in the second plate is filled with the liquid supply system LSS (not illustrated in FIGS. 9a and b). By rotation of the first and second plates 800, 810 and translation of the central axis of those plates with respect to the projection system PS the through hole 830 can be placed above any point of the substrate W while the first plate 800 still covers all of the substrate W thereby forming the enclosure.

FIG. 10 illustrates, in cross-section the first plate 800, second plate 810 and the through hole 830 in which the liquid supply system LSS is positioned.

Although the embodiment of FIGS. 9 and 10 have been illustrated with the smaller plate 810 being positioned in the through hole in the large plate 800, this may not necessarily be so and other constructional arrangements could be used. For instance, the plate 810 may be supported by and rest on a bearing on the upper surface of the first plate 800. Furthermore, translational movements of the plates 800, 810 to one another and to the substrate W and even to the liquid removal system LRS may be possible. Although the use of only two plates are described, the same principle can be applied with any number of plates fitting in or on through holes in the larger plates. For example, a third plate could be placed in the through hole 830 of the second plate 810 and rotated in that hole. The liquid supply system LSS would then fit in a through hole in the third plate. Up to five plates or more is practical.

FIGS. 11 to 14 illustrate a further embodiment of the present invention. In this embodiment, like all of the other embodiments, liquid is provided to a space between the final element of the projection system and the substrate W and is allowed to leak from that space to cover the whole of the substrate. This embodiment is particularly suitable for use with a substrate table WT whose position is measured using encoder heads 980 attached to the substrate table WT. Encoder plates 990 are positioned above the substrate table WT and they interact with the encoder heads 980 to provide positional information regarding the substrate table WT. In such an arrangement it is necessary for an unobstructed path to be present between at least three of the encoder heads 980 and their respective encoder plates 990 positioned above them. The embodiment of FIGS. 11-14 allows for this as well as for forming an enclosure above the surface of the substrate W covered in liquid for use in reducing evaporation from the liquid from a surface of the substrate.

In this embodiment a skirt 1000 is provided on the substrate table WT. This skirt 1000 is fixed in the XY axis relative to the substrate table WT but is actuatable in the Z axis (i.e. it can be retracted into the top surface of the substrate table WT or can be extended out of it). Thus the skirt 1000 which, during imaging, is stationary relative to the substrate table WT takes the place of the liquid removal system LRS of the embodiment of FIG. 7. The seal between the skirt 1000 and substrate table WT may be made as a seal with physical contact such that a liquid tight seal is formed. The skirt 1000 provides a barrier to both liquid and vapor, i.e. to fluids. The enclosure is then formed with plates 1100, 1210, 1220, 1230 which will be described below in relation to FIG. 12.

Figure 11:
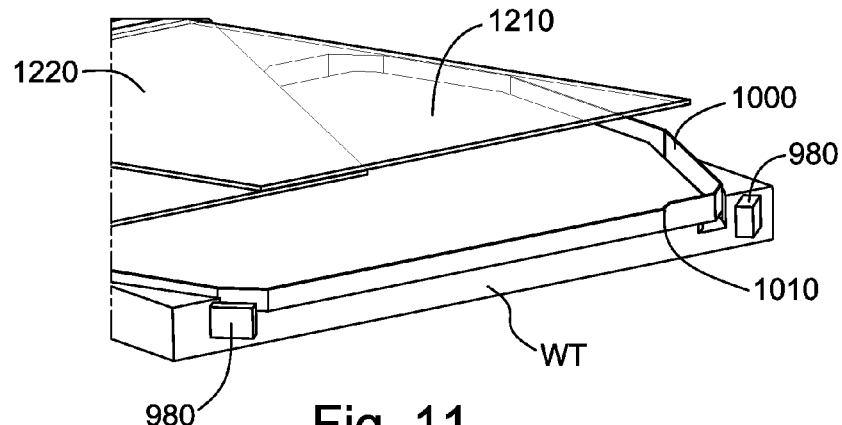
FIG. 11 illustrates, in perspective view, a detail of an embodiment illustrated in FIG. 12.
Figure 12:
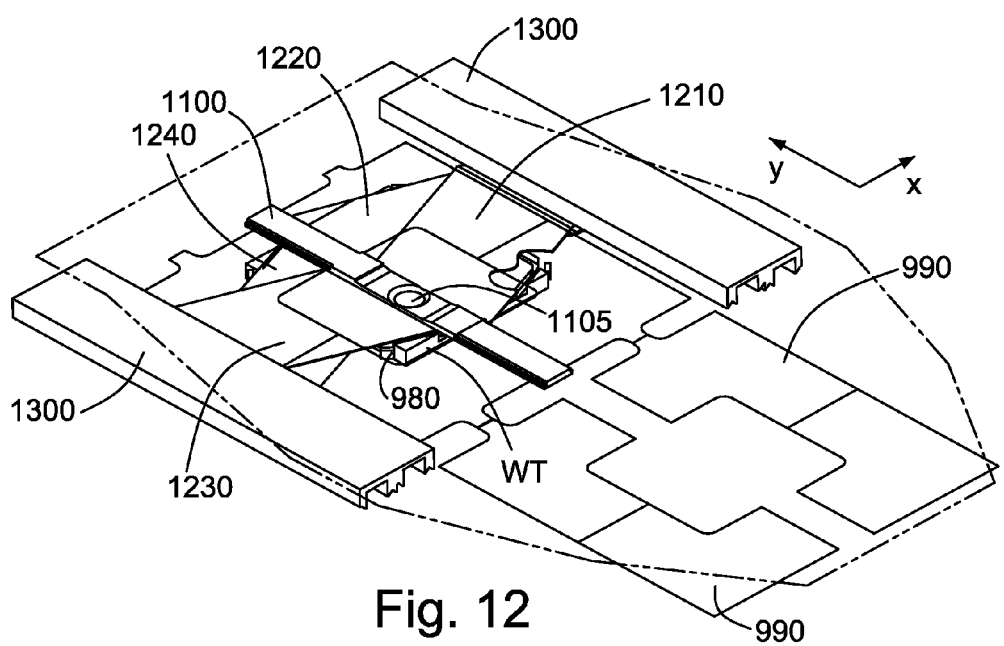
FIG. 12 illustrates, in perspective view, a further apparatus embodiment of the present invention.

The substrate table WT is divided in two parts. The substrate table illustrated in FIGS. 11 and 12 is only the top part of the substrate table WT which is often referred to as the chuck. The other part of the substrate table WT is moved with a long stroke actuator and the chuck is moved relative to the other part by a short stroke actuator. The short stroke actuator moves the chuck relative to the second part of the substrate table WT and the long stroke actuator moves the substrate table WT as a whole relative to the base frame. In order to avoid overlay errors the skirt 1000 is attached to the second part of the substrate table WT and the skirt 1000 is not in contact with the chuck at all so that it does not affect the overlap accuracy of the apparatus. One or more lever springs mounted to the long stroke module act as guides to ensure that the skirt has the correct shape.

As can be seen in FIG. 12, a central fixed plate 1100 is included in the apparatus. This fixed plate also incorporates a liquid supply system LSS configured to provide liquid between the final element of the projection system PS and the substrate W as in the above described embodiments. The plate 1100 has a through hole 1105 in it to accommodate the final element of the projection system PS. The liquid supply system LSS provides a liquid flow across that through hole 1105 in much the same way as the liquid supply system LSS provides a flow of liquid in the embodiment of FIG. 7.

The plate 1100 and integral liquid supply system LSS are held stationary relative to the projection system PS in the X-Y direction and the plate 1100 extends or is elongate in the Y-direction. The substrate table WT is moved under the projection system PS and plate 1100 during scanning.

In the embodiment illustrated, the substrate table WT is provided with four encoder heads 980 at or near each corner of the substrate table WT. In order to accurately to determine the position of the substrate table WT at least three of the four encoder heads 980 should have an unobstructed view of encoder plates 990 which are positioned above the substrate table WT and which are fixed in position relative to the projection system PS. In FIG. 12, the encoder plates 990 have been drawn next to the remainder of the apparatus for clarity. In fact the encoder plates are positioned above the substrate table WT such that each of the four encoder plates is positioned above the respective encoder head 980 such that it is above the encoder head 980 during the whole movement of the substrate table WT under the projection system PS.

Four independently moveable plates 1210, 1220, 1230 and 1240 are provided to form the top wall of the enclosure. The plates can be seen as being used to minimize the flow of gas into and out of the mini environment created above the substrate W. The plates 1210, 1220, 1230 and 1240 are actuatable along the Y axis using actuators 1300 (which may be connected to the base frame or BF or to the metrology frame MF which supports the projection system). A gap is maintained between the various plates and between the skirt 1000 and the plates so that there is no physical contact. Further the gap is kept small enough to ensure that the humidity in the enclosure formed by the skirt and plates above the substrate W can be maintained at a higher relative humidity of immersion liquid than the atmosphere outside of the enclosure. Thus the need for complicated seals may be avoided.

When the substrate table WT moves under the projection system PS and the fixed plate 1100, the area above the substrate W which needs to be covered by the plates 1210, 1220, 1230, 1240 will change. Furthermore, at least three of the four encoder heads 980 should not be covered by the plates at any one time and thus a reason for the use of four plates in this embodiment. The plates are shaped such that it is possible to cover the required area with two moveable plates 1210, 1220 and 1230, 1240 on either side of the fixed plate 1100. Each of the plates is shaped as a parallelogram and is independently moveable of the other plate on the same side of the fixed plate 1100.

As can be seen in FIG. 12, when the substrate table WT is positioned such that more of its area is on the same side of the center plate 1100 as a pair of plates 1210,1220, the bases of those plates 1210,1220 are brought closer together so that their free ends closest to the fixed plate 1110 are spread apart. Because of the specific shape of the plates 1210, 1220 the encoder heads 980 on that side are not covered by the plates but the whole of the area inside of the skirt 1000 is covered by the plates. On the other side of the fixed plate 1110, as can be seen, the bases of the plates 1230, 1240 attached to the actuator 1300 are further apart than on the other side. As a result their free ends are closer together so as to avoid covering the encoder heads 980 but still covering the area inside the skirt 1000.

If it were not for the encoder heads 980 requiring a free path to the encoder plates 990 and the position of the substrate table WT were to be measured using interferometers attached to the metrology frame and encoding plates attached to the edge of the substrate table WT, it would be possible to provide a single rectangular-shaped plate on either side of the fixed plate 1100 which would be translated parallel to the length of the fixed plate. In this case the plates would need to be wide enough to cover the entire stroke of the chuck. This would still be possible with encoder heads 980 and encoder plates 990 as shown in FIGS. 11 and 12 if the encoder heads are placed far enough out from the skirt 1000. However this leads to an increase in the size of the apparatus.

During scanning, when the substrate table WT moves in the Y-direction, the plates 1210, 1220, 1230, 1240 move with it in the Y-direction. If the substrate table WT moves in the X-direction the relative positions of the plates on either side of the fixed plate 1100 are changed. Thus if the substrate table WT in FIG. 12 were to be moved further to the left in the X-direction, the plates on the right hand side of the fixed plate 110 would be moved further away from one another whereas the plates on the left hand side of the fixed plate 1100 would be moved closer to each other. In this way the integrity of the enclosure would be maintained while the encoder heads 980 would not be covered.

As will be appreciated, the lower plate in each pair of plates (1220 and 1240) always has an edge in the same position relative to the sensor. As the substrate table WT moves in the X-direction, the portion of that edge that is adjacent to the sensor changes. Accordingly, the skirt 1000 is provided with a step 1010 to take account of the different height of the plates. However, the position of the step does not need to change as the substrate table WT moves around.

As will be appreciated, the fixed plate 1100 should be long enough to cover the joint between the pairs of cover plates over the full length of the stroke of the chuck.

The arrangement illustrated in FIGS. 11 and 12 is advantageous because the encoder heads 980 are close together in the Y-direction. However, the sensors are placed further out in the X-direction than they would need to be without the plates. Accordingly, it would be possible to use the same arrangement of plates in the X-direction as in the Y-direction leading to two levels of plates. This is at the expense of complexity.

The gap between each of the plates and the plates and the skirt and the plates and the fixed plate is of the order of 0.2 to 0.5 mm but may be as small as 0.1 mm or smaller. With this size gap, it is possible to get up to 98% relative humidity in the enclosure.

The reason that the skirt 1000 is actuated in the Z-direction is so that the substrate table WT can be moved in and out from under the projection system PS, the liquid supply system LSS and any metrology unit. Those components often need to approach the substrate WT very closely. Thus if the substrate table WT is to be moved with the skirt protruding from it, it would be necessary to actuate (lower) the whole of the substrate table WT in the Z-direction in order to avoid those components colliding with the skirt 1000 which may be between 3 and 12 mm above the surface of the substrate (in an embodiment, between 5 and 6 mm). Therefore, in order to avoid collision, the skirt 1000 is raised before the exposure sequence and lowered thereafter. The skirt may be made of carbon fiber or some form of brushes or an elastic material.

In an embodiment, the plates 1210, 1220, 1230, 1240 are manufactured from a lightweight components such as a sandwich structure or a honeycomb structure perhaps of carbon fiber or aluminum.

Figure 13:
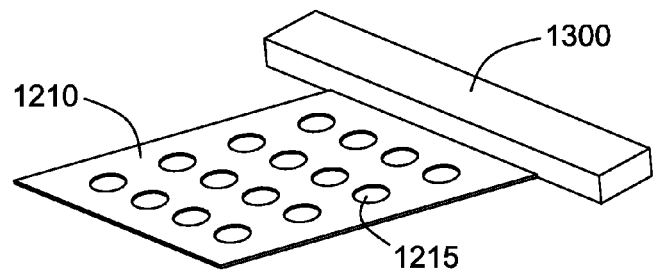
FIG. 13 illustrates, in perspective view, a close-up of a plate of the embodiment of FIG. 12.

FIG. 13 shows a plate 1210, 1220, 1230, 1240 in detail. As will be seen, the plate is manufactured with a plurality of holes 1215 in it which are covered with an elastic membrane. This membrane is elastically deflectable. This means that movement of the plate 1210 in gas will be less damped than would result if it were not for the holes 1215 covered with the membrane. This is a particular difficulty because the distance between the encoder plates 990 and the plates 1210, 1220, 1230, 1240 may only be a few mm or even as little as 0.5 mm. Because the encoder plates are mounted relative to the metrology frame whereas the moveable plates 1210, 1220, 1230, 1240 are mounted relative to the base frame, and the metrology frame is mounted on flexible mounts relative to the base frame, the plates 1210, 1220, 1230, 1240 can move relative to the encoder plates 990 in the Z-direction and this could cause gas damping which may result in cross talk between the moveable plates and encoder plates. Thus providing the plates 1210, 1220, 1230, 1240 with through holes 1215 covered in a flexible membrane prevents gas from flowing through butterfly plates but the membrane can expand upwards and downwards to accommodate the gas flow caused by relative movements of those plates to the encoder plates 990.

Figure 14:
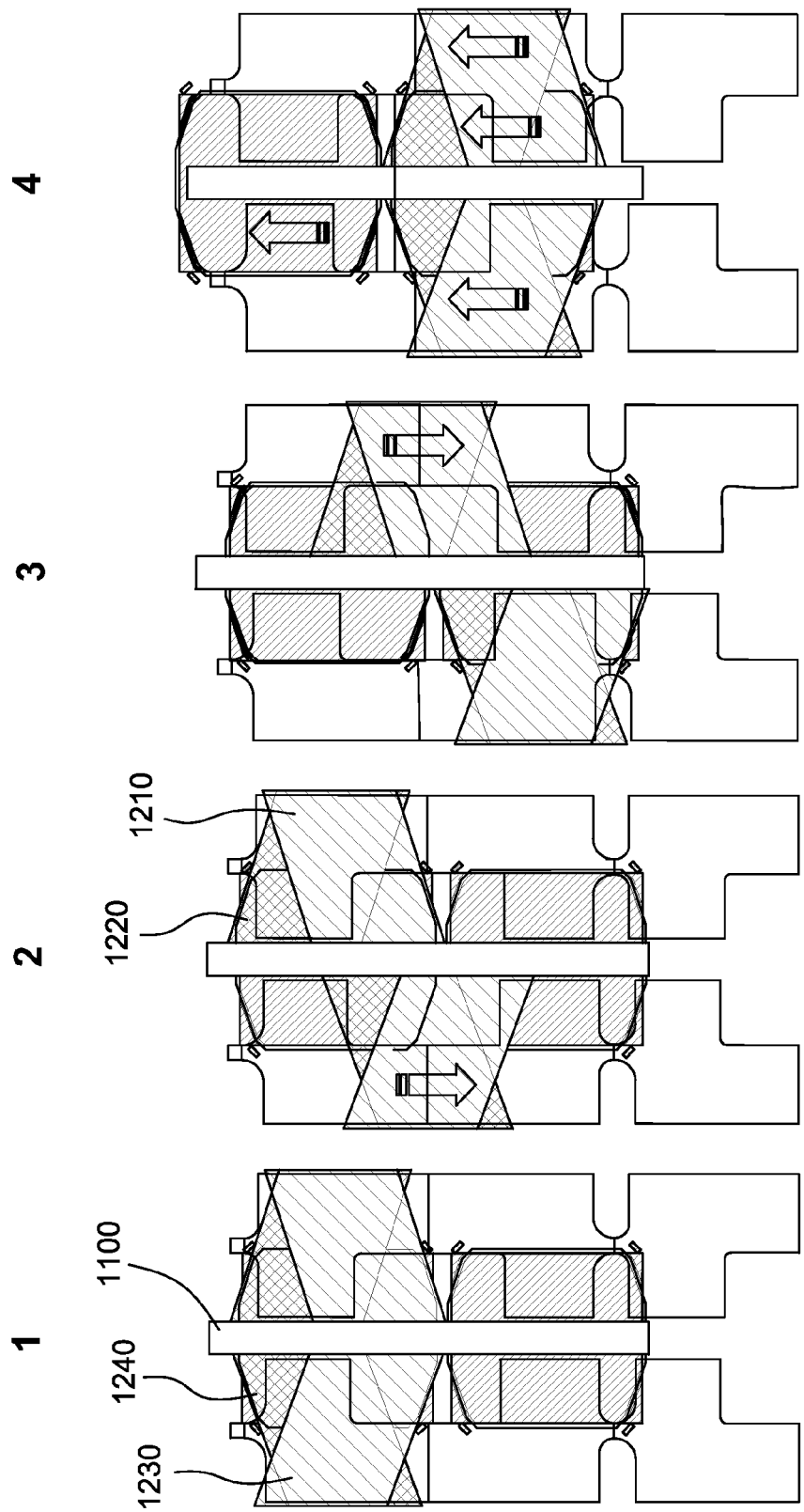
FIG. 14 illustrates, in plan, a substrate swap in the apparatus of FIGS. 11-13.

FIG. 14 shows the procedure in which the plates 1210, 1220, 1230, 1240 are transferred from one substrate table WT to another in a dual substrate apparatus configuration. Basically the plates on one side of the fixed plate 1100 are moved in unison together from covering the first substrate table to the second substrate table. During this procedure only one encoder head 980 will be covered at any one time (see step 2). Once the plates on one side of the fixed plate 1100 have been moved into position over the second substrate table, the plates on the other side of the fixed plate 1100 are moved from the first table to the second table. During this whole procedure both of the substrate tables WT remain stationary. Once all four plates have been moved to the new substrate table, both substrate tables WT can be moved so that the new substrate table is positioned under the projection system PS.

In an embodiment, the encoder plates themselves are used in place of the moveable plates. The encoder plates are fixed relative to the projection system PS in any case and are of a large enough size to be able to cover the enclosure throughout all of the stroke of the substrate table WT. Condensation of the immersion liquid on the plates may be a difficulty and steps may need to be taken to avoid that.

All of the above embodiments have the whole surface of the substrate covered in a liquid i.e. full wetting behavior so that no droplets are formed but instead a continuous film. This may require pre-wetting of the surface of the substrate W to ensure that it is all wetted. The film of liquid on the surface of the substrate not under the projection system PS should be as thin as possible without the film layer breaking up. One way of making this easier is to add a surfactant or wetting agent to the immersion liquid. Alternatively or additionally, a hydrophilic layer may be provided on a substrate so that no additive may be required. In general, the additive added to the immersion liquid should be selected in order to provide a low contact angle of the liquid with the surface of the substrate. The contact angle can be less than 70°, less than 60°, less than 50°, less than 30° or less than 15°. The additive should be transparent to the radiation used in the projection system to avoid heating due to adsorption or at least transparent enough to ensure that enough radiation reaches the resist layer properly to transfer the image on the resist layer. Such heating could affect the refractive index of the fluid which is clearly undesirable. One additive which is suitable is Optiyield 93c which is produced by Air Products and Chemicals, Inc.

In any of the above embodiments (particularly that of FIGS. 11-14) the immersion liquid may be removed through an outlet which is stationary relative to the substrate table WT. If the outlet is actually through the substrate table WT, measures may be taken to reduce the chance of inducing vibrations in the substrate table WT by the extraction or to allow evaporation in the extraction channel or allow a mixture of gas and air into the extraction channel. This can be done by designing the extractor as a single phase extractor, for instance by using a porous material in the same way as the single phase extractor as illustrated in FIG. 6 and as described above.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

One or more embodiments of the invention may be applied to any immersion lithography apparatus, in particular, but not exclusively, those types mentioned above and whether the immersion liquid is provided in the form of a bath or only on a localized surface area of the substrate. A liquid supply system as contemplated herein should be broadly construed.

In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The immersion liquid used in the apparatus may have different compositions, according to the desired properties and the wavelength of exposure radiation used. For an exposure wavelength of 193 nm, ultra pure water or water-based compositions may be used and for this reason the immersion liquid is sometimes referred to as water and water-related terms such as hydrophilic, hydrophobic, humidity, etc. may be used.

The descriptions above are intended to be illustrative, not limiting. Thus, it will be apparent to one skilled in the art that modifications may be made to the invention as described without departing from the scope of the claims set out below.

The invention claimed is:

1. A lithographic projection apparatus, comprising:
   a projection system configured to project a patterned beam of radiation onto a substrate;
   a liquid supply system configured to provide a space between the projection system and a substrate with a liquid through an outlet to contact the substrate and/or substrate table; and
   a liquid removal system comprising a barrier surrounding the outlet of the liquid supply system and configured to at least partly contain and come into contact with the liquid which has escaped from the liquid supply system, the barrier being moveable with respect to the outlet of the liquid supply system and having a seal mechanism configured to seal between the barrier and the substrate, or between the barrier and a substrate table configured to hold the substrate, or between the barrier and both the substrate and substrate table.

2. The apparatus of claim 1, further comprising a controller adapted to move the barrier such that during a movement of the substrate, the barrier is moved so as to reduce a relative velocity between the barrier and the substrate from that which would be present if the barrier did not move.

3. The apparatus of claim 2, wherein the controller is adapted to maintain the relative velocity between the barrier and the substrate during at least some movements substantially zero.

4. The apparatus of claim 1, wherein the seal mechanism is configured to create a contactless seal.

5. The apparatus of claim 1, wherein an area above the substrate, a substrate table configured to hold the substrate, or both, and between the liquid supply system and the barrier is enclosed by an enclosure.

6. The apparatus of claim 5, further comprising a humidity controller configured to control an atmosphere in the enclosed area to have a high vapor pressure of liquid.

7. The apparatus of claim 6, wherein the humidity controller is adapted to ensure that the partial pressure of liquid in the enclosed area during use is at least 70% of the vapor pressure of liquid at system temperature.

8. The apparatus of claim 1, further comprising a plate bridging a gap between the liquid supply system and the barrier above the substrate, a substrate table configured to hold the substrate, or both, thereby to enclose gas above the substrate, a substrate table configured to hold the substrate, or both.

9. The apparatus of claim 8, comprising a plurality of plates, at least some of the plates being moveable relative to each other and/or moveable relative to the liquid supply system and/or barrier.

10. The apparatus of claim 1, wherein the barrier is moveable relative to the substrate in the plane of the substrate.

11. The apparatus of claim 1, wherein the barrier is moveable in a direction perpendicular to a top surface of the substrate.

12. A lithographic projection apparatus, comprising:
   a substrate table configured to hold a substrate;
   a projection system configured to project a patterned beam of radiation onto the substrate; and
   a seal configured to surround a substrate and to at least partly contain a liquid on a surface of the substrate, the substrate table, or both, the seal moveable with respect to the substrate table under the control of a controller, the controller adapted to move the seal during at least some movements of the substrate table such that a relative velocity between the substrate table and the seal is substantially zero.

13. The apparatus of claim 12, wherein the seal is configured to form a contactless seal with the substrate, the substrate table, or both.

14. The apparatus of claim 13, wherein the contactless seal is a fluid seal.

15. The apparatus of claim 13, wherein liquid is removed through the contactless seal.

16. The apparatus of claim 12, wherein the seal comprises a gas knife configured to seal between a liquid removal device and the substrate, substrate table, or both.

17. A lithographic projection apparatus, comprising:
   a projection system configured to project a patterned beam of radiation onto a substrate;
   a liquid supply system configured to provide liquid in a space between the projection system and a substrate through an outlet to contact the substrate and/or a substrate table holding the substrate, the space being smaller in plan than the substrate; and
   an enclosure configured to enclose a space radially outwardly of the outlet of the liquid supply system and above the substrate, wherein the enclosure at least partly comprises a plate to form a wall of the enclosure opposite the substrate, and the plate is moveable with respect to the outlet during projecting of the patterned beam.

18. The apparatus of claim 17, wherein the liquid supply system is adapted to allow liquid to escape from the space and flow over the substrate.

19. The apparatus of claim 17, further comprising a humidity controller configured to control a vapor pressure of liquid in the enclosure.

20. The apparatus of claim 17, comprising a plurality of plates, at least some of the plurality of plates being translatable and/or rotatable relative to (i) the substrate, or (ii) the projection system, or (iii) the liquid supply system, or (iv) any combination of (i)-(iii).

21. The apparatus of claim 20, wherein a first plate of the plurality of plates comprises a through hole which is at least partly blocked by a second plate of the plurality of plates.

22. The apparatus of claim 21, wherein the second plate is rotatable relative to the first plate around an axis not being the center of the first plate.

23. The apparatus of claim 17, wherein the plate is independently translatable in only one axis.

24. The apparatus of claim 23, wherein the enclosure includes a center plate which is mounted stationary relative to the liquid supply system and which center plate is elongate in the one axis and comprising four plates each having an edge which is substantially parallel to an elongate edge of the center plate.

25. The apparatus of claim 17, further comprising a substrate table configured to hold the substrate, wherein the substrate table comprises a skirt to form a barrier to fluid escaping the enclosure in a direction radially outward from an optical axis of the apparatus.

26. The apparatus of claim 25, wherein the skirt is translatable so that it can be at least partly retracted into the substrate table.

27. A device manufacturing method comprising projecting a patterned beam of radiation using a projection system onto a substrate through a liquid;
supplying the liquid through an outlet of a liquid supply system to a space between the projection system and the substrate to contact the substrate and/or a substrate table holding the substrate; and
removing the liquid that has leaked from the space using a barrier surrounding the outlet of the liquid supply system, the barrier at least partly containing and coming into contact with the leaked liquid, the barrier being moveable with respect to the outlet and the barrier having a seal mechanism configured to form a seal between the barrier and the substrate, or between the barrier and a substrate table configured to hold the substrate, or between the barrier and both the substrate and substrate table.

28. A device manufacturing method comprising projecting a patterned beam of radiation using a projection system through a liquid onto a substrate, wherein a sealing device surrounds the substrate and seals liquid on a surface of the substrate, a substrate table holding the substrate, or both, and wherein the sealing device is moved with respect to the substrate table so that, during at least some movements of the substrate table, the relative velocity between the substrate table and the sealing device is reduced over the relative velocity which would exist if the sealing device remained stationary relative to the projection system.

29. A device manufacturing method comprising:
projecting a patterned beam of radiation through a liquid onto a substrate;
providing the liquid through an outlet of a liquid supply system, the liquid being in contact with the substrate and in a space between a projection system and the substrate, the space being smaller in plan than the substrate,
wherein a space radially outwardly of the outlet of the liquid supply system and above the substrate is enclosed at least partly by a plate to form a wall opposite the substrate, the plate being moveable with respect to the outlet during projecting of the patterned beam.

* * * * *